United States Patent
Lebon et al.

(10) Patent No.: US 11,522,360 B2
(45) Date of Patent: *Dec. 6, 2022

(54) CONTROL METHOD OF SUSCEPTIBLE INRUSH CURRENTS PASSING THROUGH A LOAD SWITCH, AND CORRESPONDING ELECTRONIC CIRCUIT

(71) Applicant: STMicroelectronics (Alps) SAS, Grenoble (FR)

(72) Inventors: Frederic Lebon, Grenoble (FR); Laurent Chevalier, Roissard (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/202,566

(22) Filed: Mar. 16, 2021

(65) Prior Publication Data

US 2021/0203152 A1    Jul. 1, 2021

Related U.S. Application Data

(63) Continuation of application No. 16/026,503, filed on Jul. 3, 2018, now Pat. No. 10,971,925.

(30) Foreign Application Priority Data

Jul. 24, 2017   (FR) ...................................... 1756995

(51) Int. Cl.
*H02H 9/00*   (2006.01)
*G06F 1/26*   (2006.01)
(Continued)

(52) U.S. Cl.
CPC ............... *H02H 9/002* (2013.01); *G06F 1/26* (2013.01); *H01L 27/0285* (2013.01);
(Continued)

(58) Field of Classification Search
CPC ........ H02H 9/001; H02H 9/002; H02H 9/025; H02H 9/04; H01L 27/0285; G06F 1/26
(Continued)

(56) References Cited

U.S. PATENT DOCUMENTS 9,899,834 B1* 2/2018 Mayo ....................... H02P 3/14
2013/0063116 A1   3/2013 Sun et al.
(Continued)

FOREIGN PATENT DOCUMENTS

| CN | 103001617 A | 3/2013 |
| CN | 103795385 A | 5/2014 |
| CN | 208521199 U | 2/2019 |

*Primary Examiner* — Kevin J Comber
(74) *Attorney, Agent, or Firm* — Slater Matsil, LLP

(57) ABSTRACT

An electronic circuit includes a switch coupled between an input terminal intended to receive a first voltage and an output terminal coupled to a decoupling capacitor and intended to also be coupled to a load. A comparison stage is configured to compare the first voltage and a second voltage that is present at the output terminal. A first adjustment stage is configured to limit a positive inrush current flowing between the input terminal and the output terminal and a second adjustment stage is configured to limit a negative inrush current flowing between the output terminal and the input terminal. A control circuit is configured to activate either the first adjustment stage or the second adjustment stage as a function of a result of the comparison.

20 Claims, 3 Drawing Sheets

(51) Int. Cl.
　　　*H01L 27/02*　　　(2006.01)
　　　*H02H 9/04*　　　　(2006.01)
　　　*H02H 9/02*　　　　(2006.01)
(52) U.S. Cl.
　　　CPC ............ *H02H 9/001* (2013.01); *H02H 9/025* (2013.01); *H02H 9/04* (2013.01)
(58) Field of Classification Search
　　　USPC .......................................................... 361/56
　　　See application file for complete search history.

(56) References Cited

U.S. PATENT DOCUMENTS

| | | | |
|---|---|---|---|
| 2013/0063844 A1* | 3/2013 | Sun | H01L 27/0285 |
| | | | 361/56 |
| 2015/0253743 A1 | 9/2015 | Lee et al. | |
| 2016/0226380 A1* | 8/2016 | Matsumoto | H02M 3/158 |
| 2017/0288397 A1* | 10/2017 | Wang | H01L 27/0266 |
| 2019/0027925 A1 | 1/2019 | Lebon et al. | |

* cited by examiner

CONTROL METHOD OF SUSCEPTIBLE INRUSH CURRENTS PASSING THROUGH A LOAD SWITCH, AND CORRESPONDING ELECTRONIC CIRCUIT

CROSS-REFERENCE TO RELATED APPLICATIONS

This application is a continuation application of U.S. application Ser. No. 16/026,503, filed on Jul. 3, 2018, which claims priority to French Patent Application No. 1756995, filed on Jul. 24, 2017, which applications are hereby incorporated by reference in their entirety.

TECHNICAL FIELD

Embodiments of the invention relate to a control method of susceptible inrush currents passing through a load switch, and a corresponding electronic circuit.

BACKGROUND

In a general manner, a conventional charge switch often comprises a metal oxide semiconductor (MOS) switching transistor of P-type having a low threshold voltage. To obtain a lower resistance in the "on" state of the transistor, the rating of this MOS transistor of P-type is generally bigger relative to other transistors in the same electronic circuit.

Moreover, a decoupling capacitor (or "bypass capacitor") is commonly used to be coupled in parallel to the load.

This charge switch may or may not be connected to a power supply source.

When the power supply source is initially turned on, when the charge switch is in the "on" state, and the decoupling capacitor is not charged, a positive inrush current, flowing from the power supply source to the decoupling capacitor, occurs as the capacitor begins to charge. The typical amplitude of this positive inrush current may reach a few amperes.

Additionally, when the capacitor is charged and when the power supply source is set to zero more or less rapidly, a negative inrush current, flowing from the decoupling capacitor to the power supply source, occurs as the capacitor begins to discharge. The typical amplitude of this negative inrush current may reach hundreds of milliamperes.

These positive and negative inrush currents are operationally dangerous since they are excessively greater than the nominal current for which the circuit was rated.

A conventional solution provides for a control of a first positive inrush current. However, such a solution cannot limit a possible negative inrush current and follow a new variation of the voltage of the associated power supply source.

Another conventional solution provides for the use of a precise current source, for example, based on the forbidden band (or "bandgap") principle. Nonetheless, such a solution increases not only the complexity of the electronic circuit but also its energy consumption.

SUMMARY

Modes of implementation and embodiments of the invention relate to electronic circuits, notably electronic circuits comprising at least one switch coupled between a power supply source and a load (dubbed hereinafter "charge switch"), more particularly the control of inrush currents liable to flow in the switch when a power supply source is connected to or disconnected from the switch.

Embodiments of the invention provide a solution having low complexity and low energy consumption, which makes it possible to limit positive and also negative inrush currents liable to flow through a charge switch.

According to one aspect, a method can be used to control inrush currents due to flow through a switch coupled between an input terminal liable to receive a first voltage and an output terminal coupled to a decoupling capacitor and to a load. The method comprises a comparison between the first voltage and a second voltage which is present at the output terminal, and an activation, as a function of the result of the comparison, of a first or of a second adjustment stage which is configured to respectively limit a positive inrush current flowing between the input terminal and the output terminal or a negative inrush current flowing between the output terminal and the input terminal.

According to one mode of implementation, if the first voltage is higher than the second voltage, the first adjustment stage is activated in such a way as to limit the positive inrush current. If the second voltage is higher than the first voltage, the second adjustment stage is activated in such a way as to limit the negative inrush current.

Such a method advantageously makes it possible to determine firstly the direction of an inrush current, namely positive or negative, and then to selectively activate an adjustment stage dedicated to this inrush current in such a way as to limit it properly.

According to another aspect, an electronic circuit comprises a switch coupled between an input terminal intended to receive a first voltage and an output terminal coupled to a decoupling capacitor and intended to also be coupled to a load. A comparison stage is configured to compare the first voltage and a second voltage which is present at the output terminal. A control circuit is configured to activate, as a function of the result of the comparison between, a first or a second adjustment stage, respectively, configured to limit a positive inrush current or a negative inrush current.

According to one embodiment, if the first voltage is greater than the second voltage, the control circuit is configured to activate the first adjustment stage in such a way as to limit the positive inrush current, and if the second voltage is greater than the first voltage, the control circuit is configured to activate the second adjustment stage in such a way as to limit the negative inrush current.

The switch can for example comprise a switching transistor and the first adjustment stage can for example comprise a first detection capacitor configured to transform a positive variation of the second voltage into a variation of a first intermediate current via a first current mirror module, a first reference current module configured to generate a first reference current, and a first voltage adjustment module configured to increase the voltage of the gate of the switching transistor if the first intermediate current is greater than the first reference current.

The switch can, for example, comprise a switching transistor and the second adjustment stage can, for example, comprise a second detection capacitor configured to transform a negative variation of the second voltage into a variation of a second intermediate current via a second current mirror module, a second reference current module configured to generate a second reference current, and a second voltage adjustment module configured to increase the voltage of the gate of the switching transistor if the second intermediate current is greater than the second reference current.

According to one embodiment, the switching transistor is of the pMOS type.

According to another embodiment, the first and second voltage adjustment modules respectively comprise a transistor of the pMOS type whose source is coupled to the larger of the first and second voltages and whose drain is coupled to the gate of the switching transistor.

According to yet another embodiment, the first and second reference current modules are substantially identical, the first and second reference currents are substantially identical, and the first and second voltage adjustment modules are substantially identical.

Advantageously, the circuit can for example be embodied in an integrated manner.

According to another aspect, there is proposed an electronic system, notably powered by at least one battery, comprising at least one circuit such as defined hereinabove.

According to yet another aspect, there is proposed an electronic apparatus, such as cellular mobile telephone, tablet, or laptop computer, comprising at least one system such as defined hereinabove.

BRIEF DESCRIPTION OF THE DRAWINGS

Other advantages and characteristics of the invention will become apparent on examining the detailed description of wholly non-limiting modes of implementation and embodiments, and the appended drawings in which.

DETAILED DESCRIPTION OF ILLUSTRATIVE EMBODIMENTS

Figure 1:
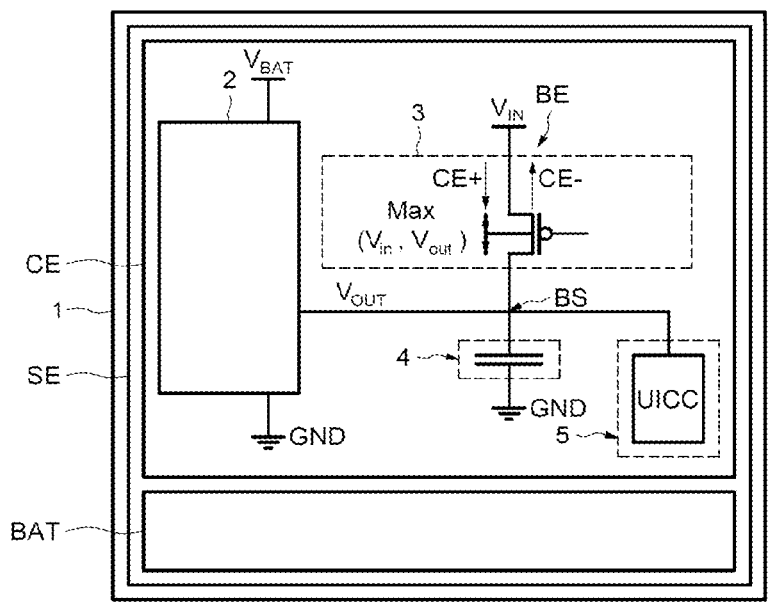
FIGS. 1 to 4 schematically illustrate modes of implementation and embodiments of the invention.

The reference 1 in FIG. 1 designates an electronic apparatus, here, for example, a cellular mobile telephone powered by a battery BAT.

The mobile telephone 1 comprises an electronic system SE embodied in an integrated manner. The electronic system SE furthermore comprises an electronic circuit CE comprising a Low-DropOut voltage regulator 2, a charge switch circuit 3, a decoupling capacitor 4, and a charge circuit 5. The Low-DropOut voltage regulator 2 is of conventional structure and is commonly known by the person skilled in the art by the acronym "LDO." This regulator 2 is coupled between the voltage VBAT of the battery and the ground GND and provides an output voltage VOUT at an output terminal BS.

The charge switch circuit 3 is coupled between an input terminal BE and the output terminal BS of the low-dropout voltage regulator 2. The decoupling capacitor 4 is coupled between the output terminal BS and the ground GND. The charge circuit 5 in this example is a Universal Integrated Circuit Card, commonly known by the person skilled in the art by the acronym "UICC."

By way of non-limiting example, the input terminal BS can be coupled to a power supply rail provided by the electronic system SE and being different from that of the battery voltage VBAT. The input terminal BE can, for example, receive an input voltage VIN whose value is greater than zero and less than or equal to the voltage VBAT of the battery. The voltage VIN can be provided by a power supply source, a low-voltage dropout regulator for example.

The mobile telephone 1 can operate in several modes, including a normal mode and a standby mode.

When the telephone 1 is operating in the normal mode, the voltage regulator 2 is powered by the voltage VBAT and delivers the output voltage VOUT at the output terminal BS. The charge switch circuit 3 is in the "off" state and consequently the charge circuit 5 and the decoupling capacitor 4 are powered by the output voltage VOUT.

When the telephone 1 is operating in the standby mode, the voltage regulator 2 is disconnected and the charge switch circuit 3 is in the "on" state. The decoupling capacitor 4 and the charge circuit 5 are therefore powered by the input voltage VIN in such a way as to improve the energy efficiency of the system SE.

If the input voltage VIN is already established when the switch circuit 3 turns on, the voltage VOUT present at the output terminal BS is less than the input voltage VIN present at the input terminal BE.

The positive rapid variation of the voltage applied Δ(VIN–VOUT) on the charge switch circuit 3 leads to a positive inrush current CE+ flowing from the input terminal BE to the output terminal BS in such a way as to charge the decoupling capacitor 4.

When the decoupling capacitor 4 is charged and when the input voltage VIN is set to zero more or less rapidly, the negative rapid variation of the voltage applied Δ(VIN–VOUT) on the charge switch circuit 3 leads to a negative inrush current CE– flowing from the output terminal BS to the input terminal BE in such a way as to discharge the decoupling capacitor 4.

A control circuit is therefore provided, which is intended to limit these inrush currents and which will be described in greater detail hereinafter.

Figure 2:
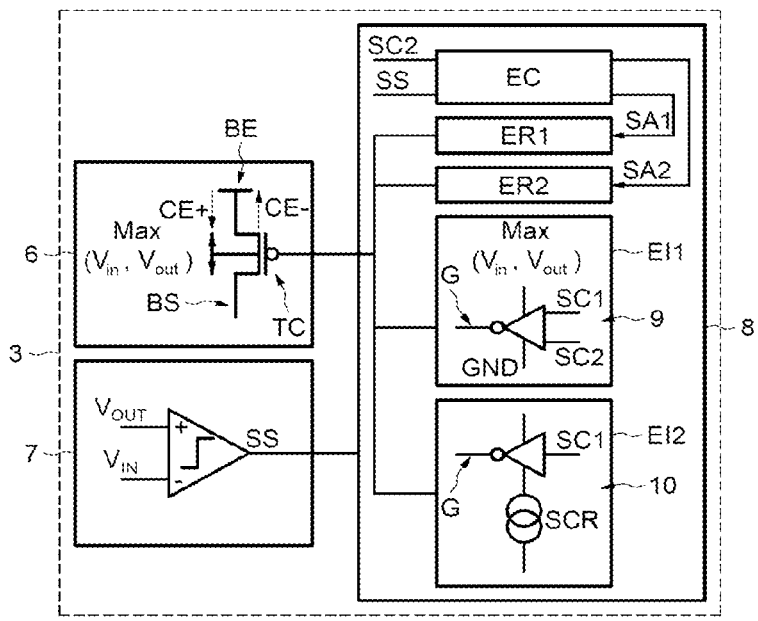

Reference is now made to FIG. 2 to illustrate very schematically an example of the charge switch circuit 3.

The charge switch circuit 3 comprises a charge switch should 6, a comparison stage 7, and a control circuit 8. The charge switch 6 comprises an MOS switching transistor TC of P type whose source is coupled to the input terminal BE, whose drain is coupled to the output terminal BS, and whose substrate is coupled to the larger of the input VIN and output VOUT voltages. The comparison stage 7 is configured to compare the input VIN and output VOUT voltages, and to deliver a selection signal SS as a function of the result of the comparison. The control circuit 8 is coupled to the gate G of the switching transistor TC and comprises a first adjustment stage ER1 and a second adjustment stage ER2.

The control circuit 8 is configured to activate the first or the second adjustment stage ER1 or ER2, as a function of the selection signal SS. Each adjustment stage ER1 or ER2 is configured to adjust the voltage of the gate of the switch 6 in such a way as to limit, respectively, the positive inrush current CE+ or the negative inrush current CE–.

By way of example, the control circuit 8 can furthermore comprise a control stage EC configured to selectively activate the first or the second adjustment stage ER1 or ER2, a first inverter stage EI1 whose output is coupled to the gate G of the switching transistor TC, and a second inverter stage EI2 whose output is also coupled to the gate G of the switching transistor TC.

The first inverter stage EI1 comprises here, for example, a three-state voltage inverter 9 powered by the larger of the input VIN and output VOUT voltages and the ground GND. The structure of a voltage inverter 9 is known per se to the person skilled in the art. This inverter 9 receives at its first input a first control signal SC1 to invert at its output on the gate of the switch, and at its second input a second control signal SC2 to enable operation of the three-state voltage inverter 9.

When the second control signal SC2 is in the low state, the first control signal SC1 is inverted on the gate G of the switching transistor TC. In the converse case, that is to say when the second control signal SC2 is in the high state, the voltage inverter 9 is in a high-impedance state.

It should be noted that the first inverter stage EI1 is not indispensable for the charge switch circuit 3 and that if the second control signal SC2 is in the low state, the input voltage VIN of the switch 3 is presumed be handled upstream in such a way as to limit a rapid variation that could lead to positive or negative inrush currents CE+, CE−.

When the first inverter stage EI1 is operating, the second inverter stage EI2, the first and second adjustment stages ER1 and ER2, and the comparator stage 7 are all configured to be deactivated.

The second inverter stage EI2 comprises here, for example, a so-called "starved" voltage inverter 10 having a limited current. This amplifier 10 is powered between the larger of the input VIN and output VOUT voltages and the ground GND through a reference current source SCR when the second control signal SC2 is in the high state.

The second inverter stage EI2 receives at its input the first control signal SC1 and delivers at its output the gate voltage VG of the switching transistor TC.

The reference current source SCR can be a simple current source, for example, comprising a current mirror generating a current proportional to the absolute temperature. This current source can, for example, also be used in the first and second adjustment stages ER1 and ER2, which will be detailed hereinafter.

It should be noted that the reference current source SCR is intended to limit the force of the voltage inverter 10 when the inverter 10 pulls the gate voltage VG of the switching transistor TC downwards in such a way as to allow the first or the second adjustment stage ER1 and ER2 to pull the gate voltage VG upwards.

The comparator stage 7 receives the input voltage VIN at its positive input and the output voltage VOUT at its negative input, and delivers the selection signal SS at its output.

When the input voltage VIN is greater than the output voltage VOUT, the selection signal SS is, for example, in the low state.

In the converse case, the input voltage VIN is less than the output voltage VOUT, and the selection signal SS is in the high state.

The control stage EC is intended to receive the second control signal SC2 and the selection signal SS, and configured to deliver respectively to the first and second adjustment stages ER1, ER2, a first activation signal SA1 and a second activation signal SA2 as a function of the control signal SC2 and selection signal SS. The control stage EC can, for example, be embodied with a conventional logic circuit.

The first activation signal SA1 is in the high state when the second control signal SC2 is in the high state and the selection signal SS is in the low state. In that case, the first adjustment stage ER1 is activated.

The second activation signal SA2 is in the high state when the second control signal SC2 is in the high state and the selection signal SS is in the high state. In that case, the second adjustment stage ER2 is activated.

Figure 3:
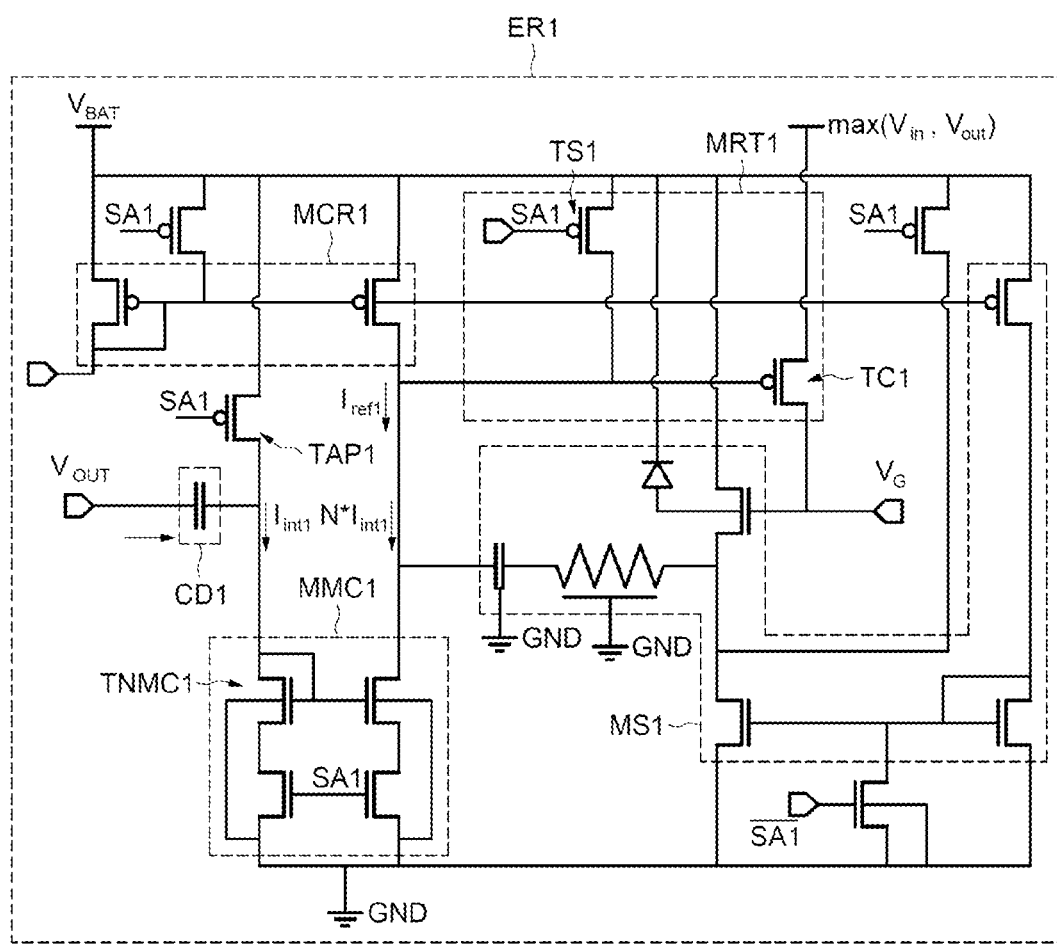

Reference is now made to FIG. 3 to schematically illustrate an exemplary embodiment of the first adjustment stage ER1.

The first adjustment stage ER1 comprises a first detection capacitor CD1 coupled to the output voltage VOUT and configured to transform a positive variation of the output voltage VOUT into a variation of a first internal current Iint1. A first current mirror module MMC1 comprises here, for example, a first current mirror of nMOS type known per se and having a current transfer ratio equal to N. A first reference current module MCR1 is configured to generate a first reference current Iref1. A first voltage adjustment module MRT1 comprises a first transistor TC1 of the pMOS type whose gate is coupled to the output of the first reference current module MCR1 and to the output of the first current mirror module MMC1, and whose source is coupled to the larger of the input VIN and output VOUT voltages and whose drain is coupled to the gate of the switch 6.

The first current mirror module MMC1 comprises a first current mirror nMOS transistor TNMC1 arranged diode-fashion whose drain is coupled to the battery voltage VBAT via a first auxiliary transistor TAP1 of the pMOS type.

At its gate, the transistor TAP1 receives the first activation signal SA1. When the first activation signal SA1 is in the low state, the transistor TAP1 is in its "on" state. The transistor TNMC1 is thus biased by the battery voltage VBAT. It should be noted that the reference SA1 illustrated in FIG. 3 is a signal complementary to the first activation signal SA1.

When the first activation signal SA1 is in the high state, the transistor TAP1 is in its "off" state. The positive variation of the voltage VOUT is transformed into the variation of the first internal current Iint1 via the first detection capacitor CD1.

The first current mirror module MMC1 is in operation by virtue of the biasing of the transistor TNMC1 via the transistor TAP1 when the first activation signal SA1 is in the low state.

This dynamic structure advantageously allows activation of the first adjustment stage ER1 only when the first activation signal SA1 is in the high state.

The first current mirror module MMC1 is configured to generate a first intermediate current $N*Iint1$ on the basis of the first internal current Iint1.

If the first intermediate current $N*Iint1$ becomes greater than the first reference current Iref1, the voltage of the gate of the first transistor TC1 decreases and the voltage of the gate VG of the switching transistor TC is therefore pulled upwards.

The first adjustment stage ER1 furthermore comprises a first stabilization module MS1 known per se to the person skilled in the art and configured to stabilize the first adjustment stage ER1.

Thus, the gate source voltage of the switching transistor TC is decreased in such a way as to reduce the positive inrush current CE+ flowing from the input terminal BE to the output terminal BS.

Figure 4:
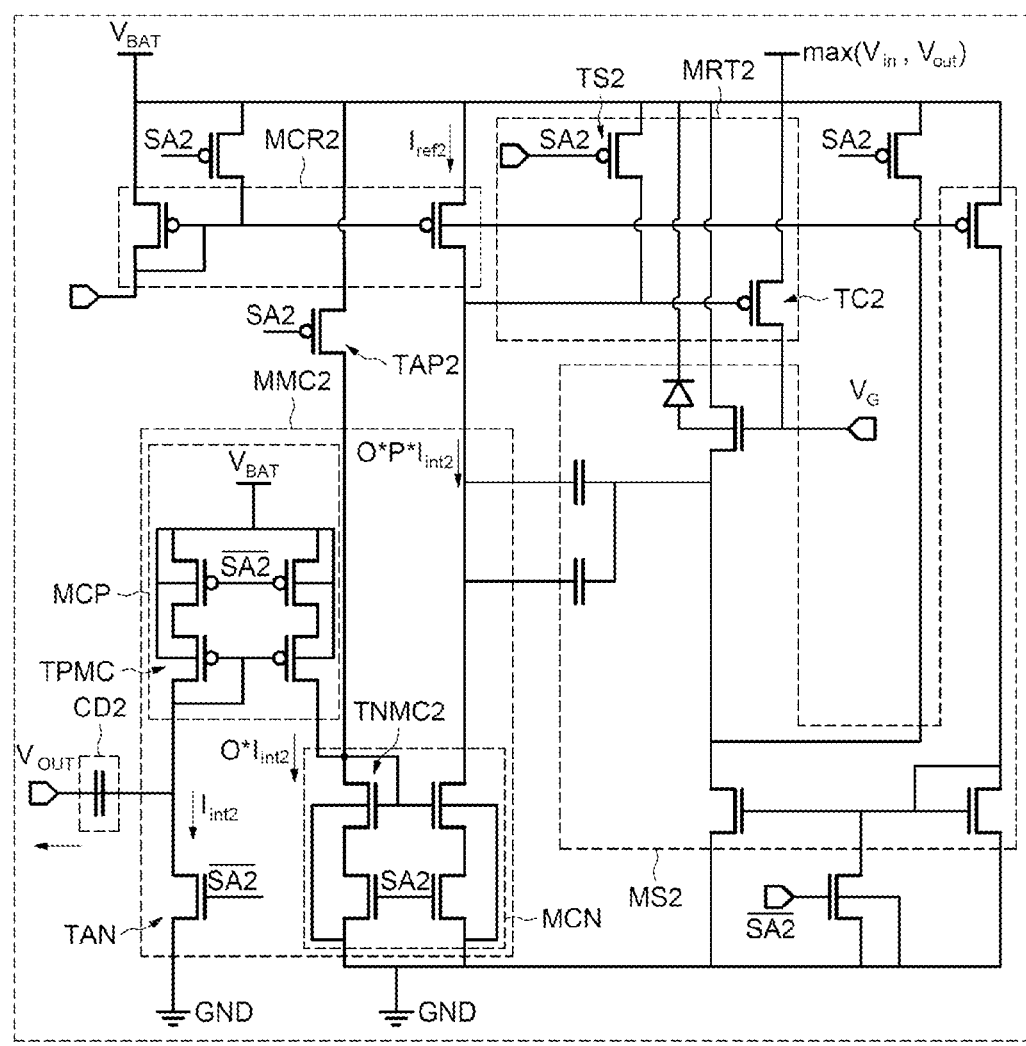

By analogy, reference is now made to FIG. 4 to schematically illustrate an exemplary embodiment of the second adjustment stage ER2.

The second adjustment stage ER2 comprises
a second detection capacitor CD2 coupled to the output voltage VOUT and configured to transform a negative variation of the output voltage VOUT into a variation of a second internal current Iint2,
a second current mirror module MMC2 comprising here, for example, a second current mirror MCP of the pMOS type and a second current mirror MCN of the nMOS type which are known per se and respectively having current transfer ratios equal to 0 and P,
a second reference current module MCR2 configured to generate the second reference current Iref2, and
a second voltage adjustment module MRT2 comprising a second transistor TC2 of the pMOS type whose gate is coupled to the output of the second reference current module MCR2 and to the output of the second current mirror module MMC2, and whose source is coupled to the larger of the input VIN and output VOUT voltages and whose drain is coupled to the gate G of the switching transistor TC.

By way of indication, the charge switch circuit 3 can receive a reference current, for example, a current proportional to the absolute temperature ("proportional to absolute temperature current"), which is copied to create the currents of the reference current source SCR, of the first source current module MCR1 and of the second reference current module MCR2.

The second current mirror MCP of the pMOS type comprises a current mirror pMOS transistor TPMC arranged diode-fashion whose drain is coupled to the ground GND via an auxiliary transistor TAN of the nMOS type.

At its gate, the transistor TAN receives a signal $\overline{SA2}$ complementary to the second activation signal SA2. When the second activation signal SA2 is in the low state, the complementary signal $\overline{SA2}$ is in the high state. The transistor TAN is consequently in its "on" state. The transistor TPMC is thus biased via the ground GND.

When the second activation signal SA2 is in the high state, the complementary signal $\overline{SA2}$ is in the low state. The transistor TAN is in its "off" state. The negative variation of the voltage VOUT is transformed into the variation of the second internal current Iint2 via the second detection capacitor CD2.

The second current mirror MCN of the nMOS type comprises a second current mirror nMOS transistor TNMC2 arranged diode-fashion whose drain is coupled to the battery voltage VBAT via a second auxiliary transistor TAP2 of the pMOS type.

Just as described hereinabove for the first current mirror nMOS transistor TNMC1 and the first auxiliary transistor TAP1, the transistor TAP2 is configured to be in the "on" state when the second activation signal SA2 is in the low state in such a way as to allow the transistor TNMC2 to be biased by the battery voltage VBAT.

The second current mirror module MMC2 is consequently in operation by virtue of the biasing of the transistor TPMC via the transistor TAN and the biasing of the transistor TNMC2 via the transistor TAP2 when the second activation signal SA2 is in the low state.

These dynamic structures advantageously allow activation of the second adjustment stage ER2 only when the second activation signal SA2 is in the high state.

It should be noted that the first or the second activation signal SA1 or SA2 is set just at the moment at which one needs to activate the first or the second adjustment stage ER1 or ER2 since the first and second adjustment stages ER1 and ER2 comprise the dynamic structures, as described hereinabove.

The second current mirror module MMC2 is configured to generate a second intermediate current O*P*Iint2 on the basis of the second internal current Iint2. It should be noted that the second current mirror MCP of the pMOS type is particularly configured to generate a current O*Iint2 whose direction is suited to the generation of the second intermediate current O*P*Iint2 via the second current mirror MCN of the nMOS type.

If the second intermediate current O*P*Iint2 becomes greater than the second reference current Iref2, the voltage of the gate of the second transistor TC2 decreases and the voltage of the gate VG of the switching transistor TC is therefore pulled upwards.

Moreover, the second adjustment stage ER2 comprises a second stabilization module MS2 known per se to the person skilled in the art and configured to stabilize the second adjustment stage ER2.

Thus, the gate source voltage of the switching transistor TC is decreased in such a way as to reduce the negative inrush current CE− flowing from the output terminal BS to the input terminal BE.

The invention is not limited to the embodiments which have just been described but embraces all variants thereof.

By way of non-limiting example, the first and second reference current modules (MCR1, MCR2) may be substantially identical.

Furthermore, the first and second reference currents (Iref1, Iref2) may be substantially identical, and the first and second voltage adjustment modules (MRT1, MRT2) may be substantially identical.

What is claimed is:

1. A circuit having a first voltage at a first terminal and a second voltage at a second terminal, the circuit comprising:
    a first adjustment stage circuit configured to limit a positive inrush current flowing between the first terminal and the second terminal;
    a second adjustment stage circuit configured to limit a negative inrush current flowing between the first terminal and the second terminal; and
    a control circuit configured to activate one of the first adjustment stage circuit or the second adjustment stage circuit based on a voltage difference between the first voltage and the second voltage.

2. The circuit of claim 1, wherein the first adjustment stage circuit is activated in response to the first voltage being greater than the second voltage.

3. The circuit of claim 1, wherein the second adjustment stage circuit is activated in response to the second voltage being greater than the first voltage.

4. The circuit of claim 1, further comprising a switching transistor coupled to a capacitor and a load at an output terminal of the switching transistor.

5. The circuit of claim 4, wherein each of the first adjustment stage circuit and the second adjustment stage circuit comprise a p-channel metal oxide semiconductor (pMOS) transistor having:
    a source node coupled to a node that carries the larger of the first voltage and the second voltage; and
    a drain node coupled to a gate of the switching transistor.

6. The circuit of claim 1, further comprising a switching transistor, wherein the first adjustment stage circuit comprises:
    a capacitor configured to transform a positive variation of the second voltage into a variation of an intermediate current;
    a current source configured to generate a reference current; and
    a first circuit configured to increase a voltage of a gate of the switching transistor in response to the intermediate current being greater than the reference current.

7. The circuit of claim 1, further comprising a switching transistor, wherein the second adjustment stage circuit comprises:
    a capacitor configured to transform a negative variation of the second voltage into a variation of an intermediate current;
    a current source configured to generate a reference current; and a first circuit configured to increase a voltage of a gate of the switching transistor in response to the intermediate current being greater than the reference current.

8. A method, comprising:
comparing a first voltage at a first terminal and a second voltage at a second terminal;
determining that the first voltage is greater than the second voltage, and, based thereon, limiting a positive inrush current flowing between the first terminal and the second terminal; and
determining that the second voltage is greater than the first voltage, and, based thereon, limiting a negative inrush current flowing between the first terminal and the second terminal.

9. The method of claim 8, wherein limiting the positive inrush current comprises:
transforming a positive variation of the second voltage into a variation of an intermediate current;
generating a reference current; and
increasing a voltage of a gate of a switching transistor in response to the intermediate current being greater than the reference current.

10. The method of claim 9, wherein the reference current is a current proportional to an absolute temperature.

11. The method of claim 8, wherein limiting the negative inrush current comprises:
transforming a negative variation of the second voltage into a variation of an intermediate current;
generating a reference current; and
increasing a voltage of a gate of a switching transistor in response to the intermediate current being greater than the reference current.

12. The method of claim 11, wherein the reference current is a current proportional to an absolute temperature.

13. The method of claim 8, wherein limiting the positive inrush current comprises generating a selection signal that activates an adjustment stage circuit.

14. The method of claim 8, wherein limiting the negative inrush current comprises generating a selection signal that activates an adjustment stage circuit.

15. A circuit, comprising:
a switching transistor having an input terminal and an output terminal;
a comparator circuit configured to determine a difference between a first voltage at the input terminal and a second voltage at the output terminal; and
a control circuit coupled to the switching transistor and the comparator circuit, the control circuit configured to limit a positive or a negative inrush current flowing between the input terminal and the output terminal of the switching transistor, the control circuit comprising:
a control stage circuit;
a first adjustment stage circuit coupled to the control stage circuit;
a second adjustment stage circuit coupled to the control stage circuit;
a first inverter stage circuit coupled to a gate of the switching transistor; and
a second inverter stage circuit coupled to the gate of the switching transistor, wherein the control stage circuit is configured to selectively activate the first adjustment stage circuit or the second adjustment stage circuit based on determining a difference between the first voltage and the second voltage.

16. The circuit of claim 15, wherein each of the first adjustment stage circuit and the second adjustment stage circuit comprise a p-channel metal oxide semiconductor (pMOS) transistor having:
a source node coupled to a node that carries the larger of the first voltage and the second voltage; and
a drain node coupled to a gate of the switching transistor.

17. A circuit, comprising:
a switching transistor having an input terminal and an output terminal;
a comparator circuit configured to determine a difference between a first voltage at the input terminal and a second voltage at the output terminal; and
a control circuit coupled to the switching transistor and the comparator circuit, the control circuit configured to limit a positive or a negative inrush current flowing between the input terminal and the output terminal of the switching transistor, the control circuit comprising:
a control stage circuit,
a first adjustment stage circuit coupled to the control stage circuit,
a second adjustment stage circuit coupled to the control stage circuit,
a first inverter stage circuit coupled to a gate of the switching transistor, and
a second inverter stage circuit coupled to the gate of the switching transistor, wherein the first inverter stage circuit comprises a three-state voltage inverter powered by the larger of the first voltage, the second voltage, and ground, wherein the first inverter stage circuit is configured to:
receive a first control signal inverting the gate of the switching transistor, and
receive a second control signal having a first state of enabling an operation of the three-state voltage inverter.

18. The circuit of claim 17, wherein enabling the operation of the three-state voltage inverter, disables the second inverter stage circuit, the first adjustment stage circuit, the second adjustment stage circuit, and the comparator circuit.

19. The circuit of claim 17, wherein the second inverter stage circuit comprises a starved voltage inverter having limited current and powered by the larger of the first voltage and second voltage and ground through a reference current source, wherein the second inverter stage circuit is configured to receive the first control signal inverting the gate of the switching transistor.

20. The circuit of claim 19, wherein the second inverter stage circuit is operational in accordance with the second control signal being in a second state of disabling an operation of the three-state voltage inverter.

* * * * *